Nov. 29, 1960 R. O. DECKER ET AL 2,962,602

PULSE WIDTH MODULATOR AND AMPLIFIER

Filed April 29, 1957 3 Sheets-Sheet 1

WITNESSES
Edwin E. Bassler
Myron E. Click

INVENTORS
Richard O. Decker &
William G. Hall
BY F. E. Browder
ATTORNEY

PULSE WIDTH MODULATOR AND AMPLIFIER

Filed April 29, 1957

United States Patent Office 2,962,602

Patented Nov. 29, 1960

2,962,602

PULSE WIDTH MODULATOR AND AMPLIFIER

Richard O. Decker, Murrysville, and William G. Hall, Pittsburgh, Pa., assignors to Westinghouse Electric Corporation, East Pittsburgh, Pa., a corporation of Pennsylvania Filed Apr. 29, 1957, Ser. No. 655,585

3 Claims. (Cl. 307—88)

This invention relates to pulse width modulators and amplifiers utilizing magnetic cores.

An object of this invention is to provide an improved system for generating pulses.

Another object of this invention is to provide an improved system for generating pulses and modulating the width of said pulses.

A further object of this invention is to provide means for generating amplified pulses and modulating the width of these amplified pulses.

Other objects of this invention will become apparent from the following description when taken in conjunction with the accompanying drawings. In said drawings, for illustrative purposes only, there are shown some preferred forms of this invention.

Figure 1:
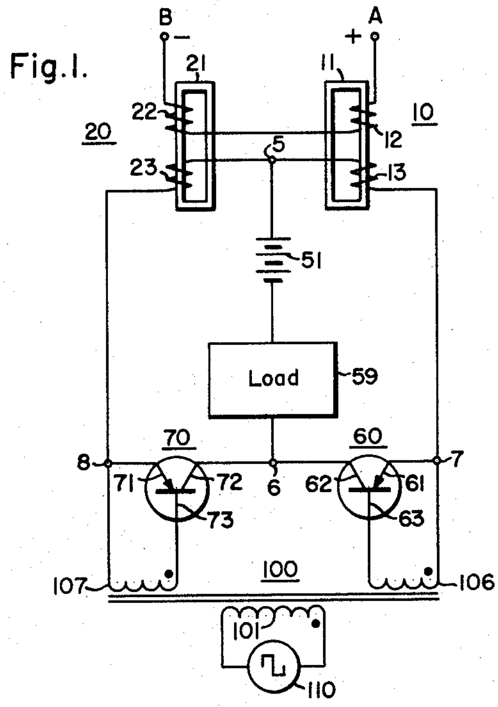
Figure 3:
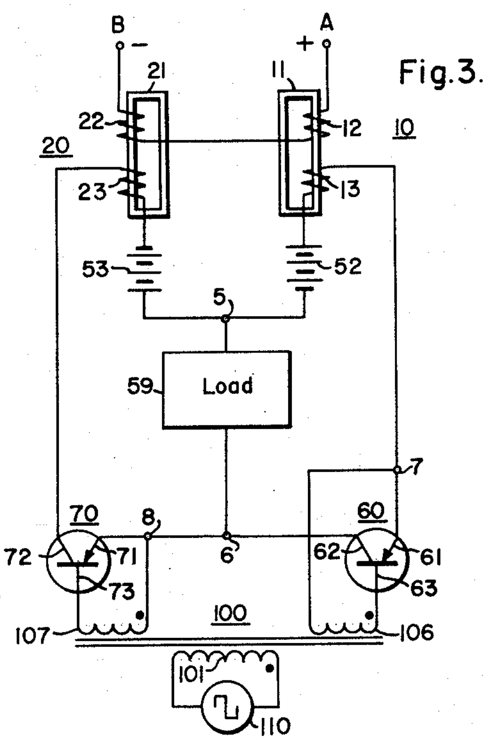
Figure 1A:
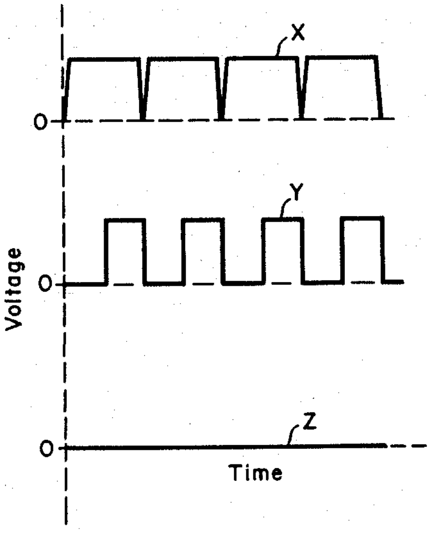
Figure 3A:
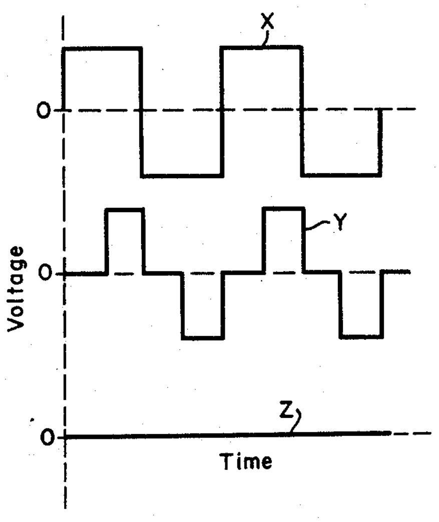
Figure 2:
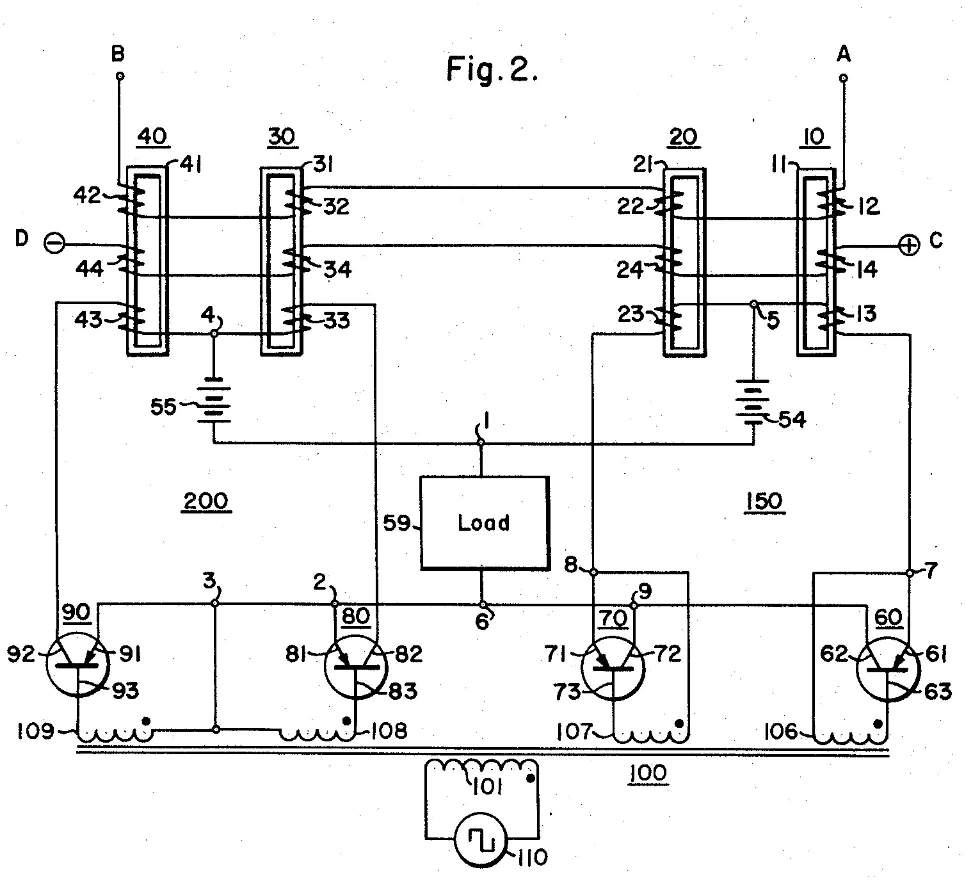
Figure 2A:
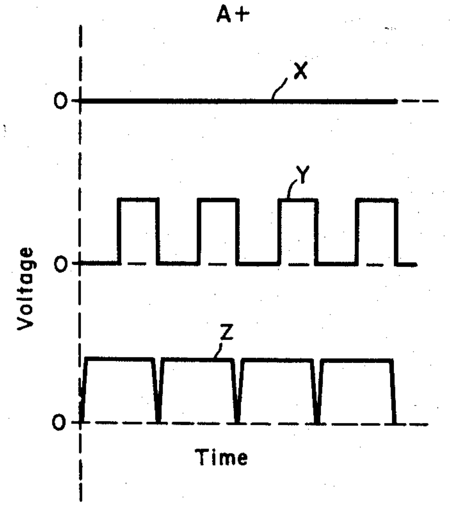
Figure 2B:
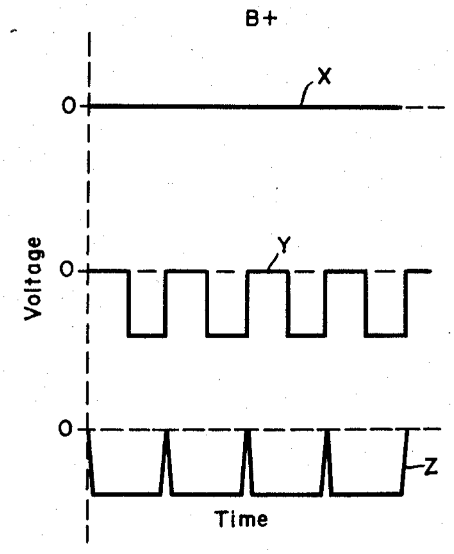
Figure 4:
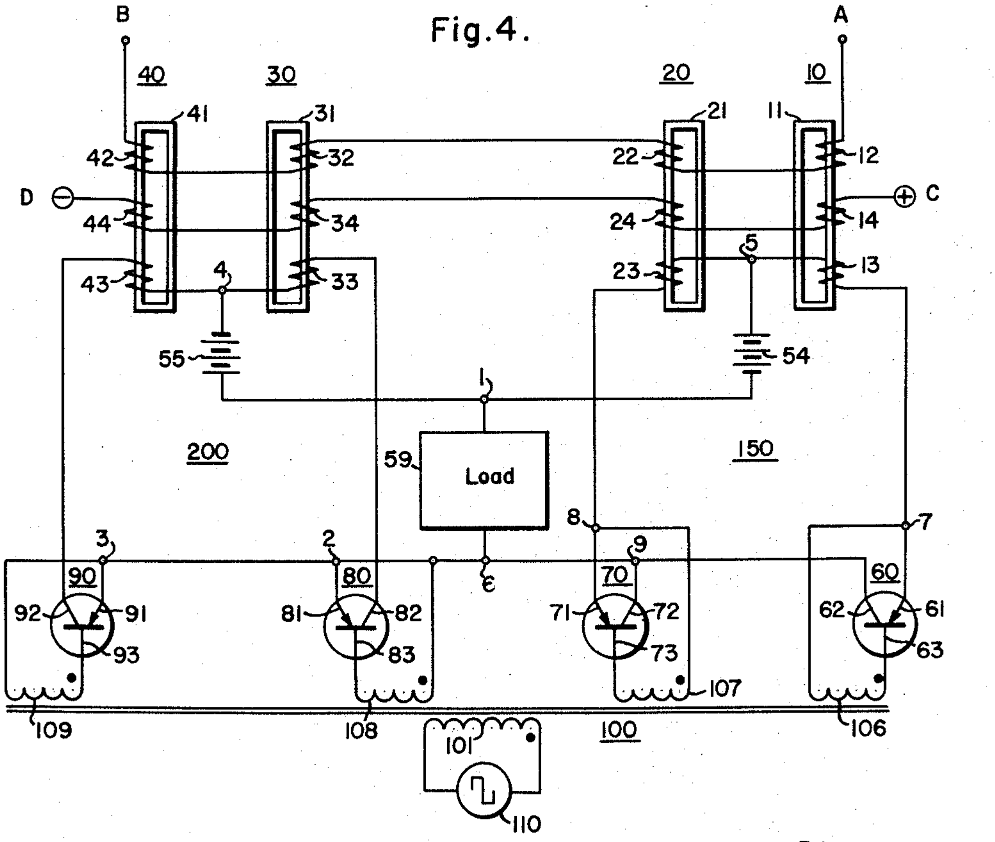
Figure 4A:
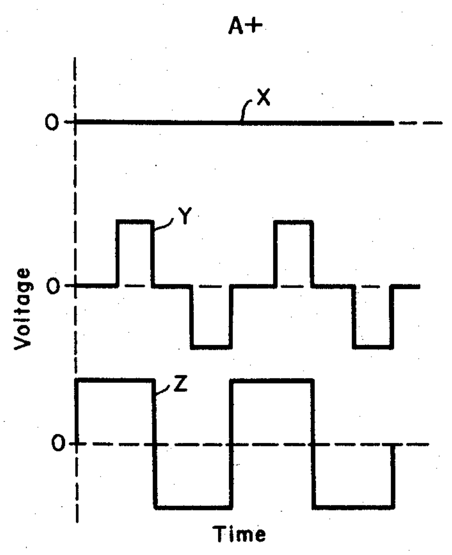
Figure 4B:
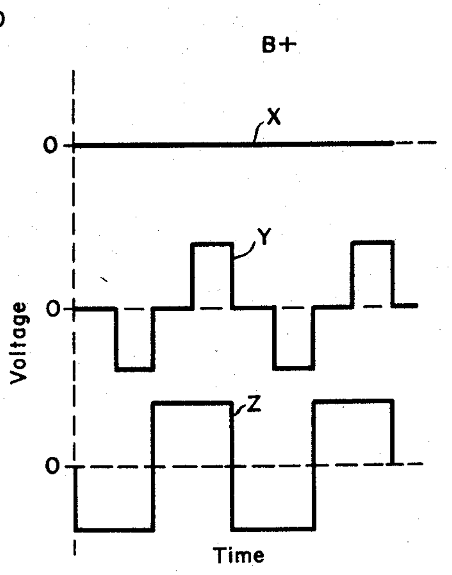

Figure 1 is a schematic diagram illustrating a basic direct current pulse modulating and amplifying circuit embodying the teachings of this invention;

Fig. 1*a* is a representation of wave forms present in the circuit of Fig. 1 for various magnitudes of control voltages;

Fig. 2 is a schematic diagram of a second embodiment of the invention illustrated in Fig. 1;

Figs. 2*a* and 2*b* are representations of wave forms present in the circuit of Fig. 2 for various magnitudes and polarities of control voltages;

Fig. 3 is a schematic diagram of a third embodiment of the invention illustrated in Fig. 1;

Fig. 3*a* is a representation of wave forms present in the circuit of Fig. 3 for various magnitudes and control voltages;

Fig. 4 is a schematic diagram of a fourth embodiment of the invention illustrated in Fig. 1; and Figs. 4*a* and 4*b* are representations of wave forms present in the circuit of Fig. 4 for various magnitudes and polarities of control voltages.

Referring to Fig. 1, there is illustrated a direct current pulse width modulator and amplifier. In general, this system comprises a suitable direct current source 51, saturable reactors 10 and 20, switching semiconductors 60 and 70, a square wave switching voltage source 110 and a load 59.

The saturable reactor 10 includes a magnetic core member 11, a control winding 12 and a load winding 13. The windings 12 and 13 are disposed in inductive relationship with the magnetic core member 11. The saturable reactor 20 includes a magnetic core member 21, a control winding 22 and a load winding 23. The windings 22 and 23 are disposed in inductive relationship with the magnetic core member 21. The control windings 12 and 22 are connected in series circuit relationship between terminals A and B. The load winding 13 of the saturable reactor 10 is connected in series circuit relationship with emitter 61 and collector 62 of the semiconductor 60 between terminals 5 and 6. The load winding 23 of the saturable reactor 20 is connected in series circuit relationship with emitter 71 and collector 72 of the semiconductor 70 between terminals 5 and 6. A base element 63 of the semiconductor 60 is connected in series circuit relationship with a secondary winding 106, of a transformer 100, to a terminal 7. A base element 73 of the semiconductor 70 is connected in series circuit relationship with a secondary winding 107, of the transformer 100, to a terminal 8. A square wave switching voltage source 110 is suitably connected to a primary winding 101 of the transformer 100. The load 59 and the direct current source 51 are connected in series circuit relationship between the terminals 5 and 6.

In operation this system can be divided into two alternately operative circuits; that is, when the semiconductors 60 and 70 are alternately conductive. The first half-cycle of the square wave switching voltage source 110 acts through the transformer 100, the primary winding 101 and the secondary winding 107, biasing the base element 73 of the semiconductor 70 to proper polarity with respect to the emitter 71, rendering the semiconductor 70 non-conductive. On the same half-cycle of the square wave switching voltage source 110, operation of the transformer 100, through the primary winding 101 and the secondary winding 106, biases the base element 63 of the semiconductor 60 to proper polarity with respect to the emitter 61, rendering the semiconductor 60 conductive. During the first half-cycle of the square wave switching voltage source 110 current flows from the positive terminal of direct current source 51 through terminal 5, load winding 13 of saturable reactor 10, terminal 7, emitter 61 and collector 62 of semiconductor 60, terminal 6 and load 59 to the negative terminal of direct current source 51. If core member 11 is unsaturated, only a very small magnetizing current flows.

The direct current source 51 is of sufficient magnitude to drive the magnetic core member 11 to substantially complete positive saturation during the half-cycle of conduction of semiconductor 60, if the flux in core member 11 is at the negative saturation level at the beginning of the first half-cycle. This means that all the volt-seconds furnished by direct current source 51 over the entire first half-cycle of square wave switching voltage source 110 will be consumed in driving magnetic core member 11 from negative saturation to substantially complete positive saturation. Therefore, no output will appear across the load 59.

On the second half-cycle of square wave switching voltage source 110, semiconductor 60 is rendered non-conductive, as described hereinbefore, by the reversal of polarity of secondary winding 106. Similarly, semiconductor 70 is rendered conductive by the reversal of polarity of secondary winding 107. Current then flows from the positive terminal of direct current source 51 through terminal 5, load winding 23 of saturable reactor 20, terminal 8, emitter 71 and collector 72 of semiconductor 70, terminal 6 and load 59 to the negative terminal of direct current source 51.

Direct current source 51 is of sufficient magnitude to drive the magnetic core member 21 to substantially complete positive saturation during the time that semiconductor 70 is conductive. If the flux in core member 21 is at the negative saturation level at the beginning of the second half-cycle, all the volt-seconds furnished by direct current source 51 over the second half-cycle of square wave switching voltage source 110 will be consumed in driving magnetic core member 21 from negative saturation to substantially complete positive saturation and no output will appear across load 59.

On the third half-cycle of square wave switching voltage source 110, semiconductor 60 will again be rendered conductive and semiconductor 70 non-conductive, as described above. Current will again flow from the positive terminal of direct current source 51 through terminal 5, load winding 13, terminal 7, emitter 61 and collector 62 of semiconductor 60, terminal 6 and load 59 to the negative terminal of direct current source 51. Still omitting control winding 12 from the analysis of the system, it is recognized by those familiar with the art that load winding 13 of saturable reactor 10 presents essentially zero impedance since magnetic core member 11 was driven to substantially complete positive saturation during the first half-cycle of square wave switching voltage source 110. Therefore, virtually the full output of direct current source 51 will appear across load 59.

On the fourth half-cycle of square wave switching voltage source 110 semiconductor 70 will again be rendered conductive, and semiconductor 60 non-conductive, as described above. Current will flow from the positive terminal of direct current source 51 through terminal 5, load winding 23 of saturable reactor 20, terminal 8, emitter 71 and collector 72 of semiconductor 70, terminal 6 and load 59 to the negative terminal of direct current source 51. Magnetic core member 21 is still substantially completely positively saturated from the second half-cycle of square wave switching voltage source 110. Therefore, load winding 23 of saturable reactor 20 presents essentially zero impedance and virtually the full output of direct current source 51 will appear across load 59.

This circuit analysis proceeded on the basis that there were no control windings on saturable reactors 10 and 20. With control windings 12 and 22 included, the above analysis holds true for the condition where the control signal presented to terminals A and B is zero. That is, after the two initial half-cycles of square wave switching voltage source 110, the output to the load will be a train of amplified, sharp, square direct current pulses. A representation of the wave form with zero control appears as curve X in Fig. 1*a*. Ideally X would appear as a straight line. As illustrated, the dips are caused by the fact that it is practically impossible to achieve complete saturation and the transistors have a finite switching time.

When a constant polarity control signal of sufficient magnitude to drive magnetic core members 11 and 21 halfway from substantially complete positive saturation towards substantially complete negative saturation is applied to terminals A and B, the analysis is affected in the following manner. Terminal A is at a positive polarity with respect to terminal B. Current will flow from terminal A through control winding 12 of saturable reactor 10 and control winding 22 of saturable reactor 20 to terminal B. Assume that the steady state condition represented by the curve X in Fig. 1*a* has been reached.

On a first half-cycle of square wave switching voltage source 110, semiconductor 60 is rendered reductive and semiconductor 70 non-conductive, as described above. Current will flow from the positive terminal of direct current source 51 through terminal 5, load winding 13, terminal 7, emitter 61 and collector 62 of semiconductor 60, terminal 6 and load 59 to the negative terminal of direct current source 51. Magnetic core member 11 has been driven halfway from substantially complete positive saturation towards substantially complete negative saturation in the preceding half-cycle when semiconductor 60 was non-conductive. Therefore, during this half-cycle of square wave switching voltage source 110, the volt-seconds of direct current source 51 are partially consumed in again driving magnetic core member 11 towards substantially complete positive saturation. When magnetic core member 11 reaches this point of maximum positive saturation, the load winding 12 again presents essentially zero impedance and the output of direct current source 51 appears across load 59 for the remainder of this half-cycle.

On the next half-cycle of square wave switching voltage source 110, semiconductor 70 is rendered conductive and semiconductor 60 non-conductive, as described above. Current flows from the positive terminal of direct current source 51 through terminal 5, load winding 23 of saturable reactor 20, terminal 8, emitter 71 and collector 72 of semiconductor 70, terminal 6 and load 50 to the negative terminal of direct current source 51. Magnetic core member 21 was reset from substantially complete positive saturation half way towards substantially complete negative saturation by the action of the constant polarity control signal appearing at terminals A and B during the preceding half-cycle when semiconductor 70 was non-conductive. Therefore, during this half-cycle, the volt-seconds of direct current source 51 are partially consumed in driving magnetic core member 21 towards substantially complete positive saturation. When magnetic core member 21 reaches this point of maximum positive saturation, the load winding 22 presents essentially zero impedance and the output of direct current source 51 appears across load 59 for the remainder of this half-cycle.

Thus, for succeeding half-cycles of the square wave switching voltage source 110, the output to load 59 is a train of direct current pulses whose width has been modulated form that of curve X of Fig. 1*a* by the application of a constant polarity control signal to terminals A and B. A representation of this particular wave form is designated by curve Y in Fig. 1*a*.

If the constant polarity control signal appearing at terminals A and B is increased to a sufficient magnitude to drive magnetic core members 11 and 21 to substantially complete negative saturation, the analysis proceeds in the following manner. On the first half-cycle of square wave switching voltage source 110, semiconductor 60 is rendered conductive and semiconductor 70 non-conductive, as described above. Current will flow from the negative terminal of direct current source 51 through terminal 5, load winding 13 of saturable reactor 10, terminal 7, emitter 61 and collector 62 of semiconductor 60, terminal 6 and load 59 to the negative terminal of direct current source 51. However, the volt-seconds from the constant polarity control signal have driven magnetic core member 11 to substantially complete negative saturation during the preceding half-cycle when semiconductor 60 was non-conductive. Therefore, during this half-cycle, the whole period of conduction of semiconductor 60, the volt-seconds furnished by direct current source 51 will be consumed in driving magnetic core member 11 back to substantially complete positive saturation and no output will appear across load 59.

Similarly, on the next half-cycle of square wave switching voltage source 110, semiconductor 70 is rendered conductive and semiconductor 60 non-conductive, as described above. No output will appear across load 59 because the entire amount of volt-seconds furnished by direct current source 51 will be consumed in driving magnetic core member 21 from substantially complete negative saturation to substantially complete positive saturation. During succeeding alternate periods of non-conduction by semiconductors 60 and 70, the saturable reactors 10 and 20, respectively, will be fully reset to substantially complete negative saturation by the constant polarity control signal. During succeeding alternate periods of conduction by semiconductors 60 and 70, saturable reactors 10 and 20, respectively, will only be brought to substantially complete positive saturation and no output will appear across load 59. For this full control condition, the representative wave form across load 59 is shown by curve Z of Fig. 1*a*.

From the above description, it is evident that any desired modulation of the pulse width can be obtained by applying the proper amount of constant polarity control signal to terminals A and B. The desired amplification is obtained by varying the magnitude of direct current source 51. Pulse frequency, of course, is varied by changing the frequency of square wave switching voltage source 110.

Referring to Fig. 2, there is illustrated another embodiment of the teachings of this invention, in which like components of Figs. 1 and 2 have been given the same reference characters. The main distinction between the apparatus illustrated in Figs. 1 and 2 is that in Fig. 2 another basic direct current output circuit similar to that of Fig. 1 has been added making it a push-pull system with a reversible direct current pulse output to the load. This addition includes saturable reactors 30 and 40 and switching semiconductors 80 and 90. In place of direct current source 51, we now have two direct current sources which are designated 54 and 55. Bias windings 14, 24, 34 and 44 are added to saturable reactors 10, 20, 30 and 40.

Saturable reactor 10 now includes magnetic core member 11, control winding 12, load winding 13, and bias winding 14. Windings 12, 13 and 14 are disposed in inductive relationship with magnetic core member 11. Saturable reactor 20 now includes magnetic core member 21, control winding 22, load winding 23 and bias winding 24. Windings 22, 23 and 24 are disposed in inductive relationship with magnetic core member 21. Saturable reactor 30 includes magnetic core member 31, control winding 32, load winding 33 and bias winding 34. Windings 32, 33 and 34 are disposed in inductive relationship with magnetic core member 31. Saturable reactor 40 includes magnetic core member 41, control winding 42, load winding 43 and bias winding 44. Windings 42, 43 and 44 are disposed in inductive relationship with magnetic core member 41. Control windings 12, 22, 32 and 42 are connected in series circuit relationship between terminals A and B. Bias windings 14, 24, 34 and 44 are connected in series circuit relationship between terminals C and D.

Load winding 13 of saturable reactor 10 is connected in series circuit relationship with the emitter 61 and the collector 62 of semiconductor 60 between terminals 5 and 6. Load winding 23 of saturable reactor 20 is connected in series circuit relationship with the emitter 71 and the collector 72 of semiconductor 70 between terminals 5 and 6. Base element 63 of semiconductor 60 is connected in series circuit relationship with the secondary winding 106, of the transformer 100, to the terminal 7. The base element 73 of the semiconductor 70 is connected in series circuit relationship with the secondary winding 107, of the transformer 100, to the terminal 8. Direct current source 54 is connected to terminals 5 and 1.

The load winding 33 of saturable reactor 30 is connected in series circuit relationship with the collector 82 and the emitter 81 of semiconductor 80 between terminals 5 and 6. The load winding 43 of the saturable reactor 40 is connected in series circuit relationship with the collector 92 and the emitter 91 of semiconductor 90 between terminals 5 and 6. The base element 83 of the semiconductor 80 is connected in series circuit relationship with the secondary winding 108, of transformer 100, to a terminal 3. The base element 93 of semiconductor 90 is connected in series circuit relationship with the secondary winding 109, of transformer 100, to the terminal 3. The direct current source 55 is connected to terminals 4 and 1.

The load 59 is connected to terminals 1 and 6. A square wave switching voltage source 110 is suitably connected to primary winding 101 of transformer 100. The terminal C is at all times positive with respect to the terminal D, receiving a constant polarity signal of sufficient magnitude to drive the magnetic core members 11, 21, 31 and 41 to substantially complete negative saturation through the flux induced therein by the bias windings 14, 24, 34 and 44, respectively.

The circuit generally designated as 150, comprising saturable reactors 10 and 20, direct current source 54 and semiconductors 60 and 70, and the circuit designated generally as 200, comprising saturable reactors 30 and 40, direct current source 55 and semiconductors 80 and 90, operate in a jush-pull manner to supply the load 59.

When the control terminal A is at a positive polarity with respect to control terminal B, the flux change in the magnetic core members 11 and 21 caused by the control windings 12 and 22, respectively, will oppose the flux change in the magnetic core members 11 and 21 caused by the bias windings 14 and 24, respectively. The flux change caused by the bias windings 14 and 24 in the magnetic core members 11 and 21, respectively, always opposes that induced by the load windings 13 and 23 in the magnetic core members 11 and 21, respectively. This means that when the control terminal A is at a positive polarity with respect to the control terminal B, the control windings 12 and 22 and the bias windings 14 and 24 of the saturable reactors 10 and 20 cooperate to render the circuit designated generally at 150 operative to deliver an output to load 59.

When the control terminal A is at a positive polarity with respect to the control terminal B, the flux change in the magnetic core members 31 and 41 caused by the control windings 32 and 42, respectively, will aid the flux change in the magnetic core members 31 and 41 caused by the bias windings 34 and 44, respectively. The flux change caused by the bias windings 34 and 44 in the magnetic core members 31 and 41, respectively, always opposes that caused by the load windings 33 and 43 in the magnetic core members 31 and 41, respectively. This means that when the control terminal A is at a positive polarity with respect to the control terminal B, the control windings 32 and 42 and the bias windings 34 and 44 of the saturable reactors 30 and 40 cooperate to render the circuit designated generally as 200 inoperative to deliver an output to the load 59.

Similarly, when the control terminal B is at a positive polarity with respect to the control terminal A, the flux change in magnetic core members 11, 21, 31 and 41 caused by the control windings 12, 22, 32 and 42 will be in a reverse direction as when the control terminal A is at a positive polarity with respect to the terminal B. It can readily be seen that this reversal of flux will render the circuit designated generally at 200 operative to deliver an output to the load 59 and the circuit designated generally at 150 inoperative to deliver an output to the load 59.

The operation of the circuit 150, including the saturable reactors 10 and 20, in supplying the load 59 can be divided again into two alternately operative circuits as hereinbefore described in the operation of Fig. 1, that is, when the semiconductors 60 and 70 are alternately conducting. The overall operation of the saturable reactors 10 and 20 is essentially the same as described in Fig. 1 with the following distinctions. The bias windings 14 and 24 are so wound on the magnetic core members 11 and 21, respectively, that the flux change caused by them in the magnetic core members 11 and 21 at all times opposes the flux change caused by the load windings 13 and 23 and the magnetic core members 11 and 21. The control windings 12 and 22 are so wound on the magnetic core members 11 and 21, respectively, that the flux change caused by them in the magnetic core members 11 and 21 aids the flux change caused by the load windings 13 and 23 and the magnetic core members 11 and 21.

Thus, on the first half-cycle of the square wave switching voltage source 110, when the semiconductor 60 is conducting and the semi-conductor 70 is not conducting, as hereinbefore described, the load winding 13 is driving the magnetic core member 11 towards substantially complete positive saturation. The bias winding 14 is driving magnetic core member 11 towards substantially complete negative saturation.

Similarly, on the next half-cycle of the square wave switching voltage source 110, when semi-conductor 70 is conducting and the semiconductor 60 is not conducting, the load winding 23 is driving magnetic core member 21 towards substantially complete positive saturation. This bias winding 24 is driving magnetic core member 21 towards substantially complete negative saturation. Therefore for these two half-cycles of operation, and for succeeding half-cycles, if the control signal presented to terminal A is zero there will be no output to the load 59. The representation of this output of circuit 150 for zero control is shown by curve X of Fig. 2*a*.

As a positive control signal is presented to the control terminal A of sufficient magnitude to drive the magnetic core members 11 and 21 halfway towards substantially complete positive saturation by the flux change therein caused by the control windings 12 and 22, respectively, there will be a cooperation with the flux change in the magnetic core members 11 and 21 caused by load windings 13 and 23, respectively, that will overcome the opposing flux change caused by the bias windings 14 and 24 in the magnetic core members 11 and 21, respectively. An output from the circuit 150 to the load 59 will appear. A representation of this output for half control is shown by curve Y of Fig. 2*a*.

As a positive control signal is presented to control terminal A of sufficient magnitude to drive the magnetic core members 11 and 21 to substantially complete positive saturation by the flux change caused therein by the control windings 12 and 23, respectively, there will be a cooperation with the flux change in the magnetic core members 11 and 21 caused by the load windings 13 and 23, respectively, and the bias windings 14 and 24, respectively. A representation of this output from circuit 1 for full control is shown by curve Z of Fig. 2*a*.

The saturable reactors 30 and 40 of the circuit 200 have contributed nothing toward supplying the load 59 during the above described period when the control terminal A is at a positive polarity with respect to the control terminal B. A reversal of the polarity of the constant polarity control signal causes the terminal B to become positive with respect to the terminal A and, in the manner described hereinbefore, renders the circuit 150, including the saturable reactors 10 and 20, inoperative to deliver an output to the load 59 and renders the circuit 200 operative to deliver an output to the load 59. At this time the switching action of the semiconductors 80 and 90 becomes important as to supplying the load 59. On the first half-cycle of the square wave switching voltage source 110, the semi-conductor 80 is rendered conductive by the action of the square wave switching voltage source 110 through the transformer 100 in biasing the base element 83 to the proper polarity with respect to the emitter 81. On the same half-cycle of the square wave switching voltage source 110, the semiconductor 90 is rendered non-conductive by the action of the switching voltage through the transformer 100 in biasing the base element 93 to the proper polarity with respect to the emitter 91.

Thus, on the first half-cycle of the square wave switching voltage, current flows in the load winding 33, in the manner hereinbefore described, driving the magnetic core member 31 toward substantially complete positive saturation. The current flowing in the bias winding 34 is driving the magnetic core member 31 toward substantially complete negative saturation.

Similarly, on the next half-cycle of the square wave switching voltage source 110, the semi-conductor 90 is rendered conductive and the semi-conductor 80 non-conductive as hereinbefore described. Current flows from the direct current source 55 through the load winding 43 in a manner also hereinbefore described. The bias winding 44 is driving the magnetic core member 41 towards substantially complete negative saturation. Therefore, for these two half-cycles of operation, and for succeeding half-cycles, if the control signal presented to the terminal B is zero, there will be no output to the load 59. The representation of this output of circuit 200 for zero control is shown by curve X of Fig. 2*b*.

As a positive control signal is presented to the control terminal B, of sufficient magnitude to drive the magnetic core members 31 and 41 halfway towards substantially complete positive saturation by the flux change therein caused by the control windings 32 and 42, respectively, there will be a cooperation with the flux change in the magnetic core members 31 and 41, respectively. An output from circuit 200 to the load 59 will appear. A representation of this output for half control is shown by curve Y of Fig. 2*b*.

As a positive control signal is presented to the control terminal B, of sufficient magnitude to drive the magnetic core members 31 and 41 to substantially complete positive saturation by the flux change therein caused by the control windings 32 and 42, respectively, there will be a cooperation with the flux change in the magnetic core members 31 and 41 caused by the load windings 33 and 43, respectively, that will overcome the opposing flux change caused by the bias windings 34 and 44 in the magnetic core members 31 and 41, respectively. A representation of this output for circuit 200 for full control is shown by curve Z of Fig. 2*b*.

As will be noted from a comparison of the representative curves of Fig. 2*a* and Fig. 2*b*, the polarity of the output to the load 59 from the circuit 200 shown in Fig. 2*b* has been reversed with respect to the polarity of the output from the circuit 1 to the load 59 shown in Fig. 2*a*. This is accomplished by connecting opposite polarity terminals of the direct current sources 54 and 55 in the circuits 150 and 200, respectively, to the same load terminal. A single center tapped direct current source would serve as well if the center tap was connected to one load terminal and the end taps, through the disclosed circuitry, to the other load terminal.

Referring to Fig. 3, there is illustrated yet another embodiment of the teachings of this invention, in which like components of Figs. 1 and 3 have been given the same reference characters. The main distinction between the apparatus illustrated in Figs. 1 and 3 is that in Fig. 3 there has been substituted two direct current sources 52 and 53 for the direct current source 51. The operation for the apparatus in Fig. 3 is essentially the same as that of Fig. 1. The difference is apparent in the output to the load 59. Since the direct current sources 52 and 53 have been connected in the circuit with opposite polarity terminals connected to the same load terminal, it is possible to obtain an alternating pulse output to the load 59. These outputs are shown by curves X, Y and Z of Fig. 3*a*. Curve X represents the zero control signal of Fig. 1 at terminals A and B; curve Y represents the half control signal of Fig. 1 at terminals A and B; and curve Z represents the full control signal of Fig. 1 at terminals A and B.

Referring to Fig. 4, there is illustrated still another embodiment of the teachings of this invention, in which like components of Figs. 2 and 4 have been given the same reference characters. The main distinction between the apparatus illustrated in Figs. 2 and 4 is that in Fig. 4 the polarities of the control windings 22 and 32 have been reversed and the polarity of the secondary windings 108 and 109 as connected to the base elements 83 and 93, respectively, have also been reversed. The operation of the apparatus illustrated in Fig. 4 is similar to that of Fig. 2 except that the different switching times of semiconductors 80 and 90 now give us an alternating pulse output to the load 59.

When the terminal A is at a positive polarity with respect to the terminal B, the family of curves representing the alternating pulse outputs for various magnitudes of control voltages are shown by Fig. 4*a*. The curve X represents zero control and is comparable to the zero control of Fig. 2*a*. The curve Y represents half control and is comparable to the half control of Fig. 2*a*. The curve Z represents full control and is comparable to the full control of Fig. 2*a*.

When the terminal B is at a positive polarity with respect to the terminal A, the family of curves representing the alternating pulse outputs for the various magnitudes of control voltage is shown in Fig. 4*b*. The curve X represents zero control and is comparable to the zero control of Fig. 2*b*. The curve Y represents half control and is comparable to the half control of Fig. 2*b*. The curve Z represents full control and is comparable to the full control of Fig. 2*b*.

These circuits have certain advantages. A controllable sharp pulse is obtained when a square wave switching voltage source is used. These pulses are ideal for controlling other transistor circuits. The amplifier can operate from a direct current supply to deliver either alternating current or direct current pulses of high frequency, and the high frequency switching source need supply only a small amount of switching power. This amplifier can operate at a much higher frequency than that of the main alternating current supply. Magnetic amplifier circuits that operate from low frequency sources, e.g., 60 cycles, require fairly large cores with a large number of turns on them. The same powers can be controlled with the circuits described here, but if the alternating current supply is rectified, and a high frequency switching signal is used, the size of the cores required is considerably reduced. Also, the response time of the amplifier will be reduced considerably.

In conclusion, it is pointed out that while the illustrated examples constitute a practical embodiment of our invention, we do not limit ourselves to the exact details shown since certain modifications of the same may be varied without departing from the spirit of the invention.

We claim as our invention:

1. In a pulse generating system, a saturable core having an input winding and a load winding inductively associated therewith, a transistor having a base, an emitter and a collector, a load circuit including said load winding, said emitter and collector, a source of direct current and a load; and means for applying a bipolar rectangular waveform directly between said emitter and said base.

2. In a pulse generating system, first and second saturable cores having first and second load windings and first and second input windings respectively, a first and a second transistor each having a base, collector and emitter electrodes, a first load circuit including a source of direct current voltage, said first load winding and the emitter and collector electrodes of said first transistor, a second load circuit including said source of direct current voltage, said second load winding, and the emitter and collector electrodes of said second transistor, and means for applying a bipolar rectangular waveform directly between the emitter and base electrodes of said first and second transistors to render said transistors alternately conductive for a predetermined time.

3. In a pulse generating system, first and second saturable cores having first and second load windings and first and second input windings respectively, a first and a second transistor each having a base, a collector and emitter electrode, a first load circuit including a first source of direct current voltage, said first load winding and the emitter and collector electrodes of said first transistor, a second load circuit including a second source of direct current voltage, said second load winding and the emitter and collector electrodes of said second transistor, and means for applying a bipolar rectangular waveform directly between the emitter and base electrodes of said first and said second transistors to render said first and said second transistors alternately conductive.

References Cited in the file of this patent

UNITED STATES PATENTS

| | | |
|---|---|---|
| 2,798,169 | Eckert | July 2, 1957 |
| 2,809,303 | Collins | Oct. 8, 1957 |
| 2,830,197 | Spencer et al. | Apr. 8, 1958 |
| 2,834,893 | Spencer | May 13, 1958 |